United States Patent
Kwon et al.

(10) Patent No.: US 7,596,026 B2
(45) Date of Patent: Sep. 29, 2009

(54) PROGRAM METHOD OF NON-VOLATILE MEMORY DEVICE

(75) Inventors: Oh-Suk Kwon, Gyeonggi-do (KR); June Lee, Seoul (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 0 days.

(21) Appl. No.: 11/679,072

(22) Filed: Feb. 26, 2007

(65) Prior Publication Data

US 2007/0140013 A1    Jun. 21, 2007

Related U.S. Application Data

(63) Continuation of application No. 10/976,628, filed on Oct. 29, 2004, now abandoned.

(30) Foreign Application Priority Data

May 17, 2004    (KR) ................................ 2004-34863

(51) Int. Cl.
*G11C 16/04* (2006.01)
(52) U.S. Cl. ........................ 365/185.17; 365/185.14; 365/185.28
(58) Field of Classification Search ............ 365/185.17
See application file for complete search history.

(56) References Cited

U.S. PATENT DOCUMENTS

| | | | | |
|---|---|---|---|---|
| 5,621,684 | A * | 4/1997 | Jung ..................... | 365/185.17 |
| 5,673,223 | A * | 9/1997 | Park ..................... | 365/185.17 |
| 5,677,873 | A | 10/1997 | Choi et al. | |
| 5,991,202 | A | 11/1999 | Derhacobian et al. | |
| 6,307,785 | B1 * | 10/2001 | Takeuchi et al. ....... | 365/185.23 |
| 6,504,757 | B1 * | 1/2003 | Hollmer et al. ........ | 365/185.18 |
| 6,661,707 | B2 * | 12/2003 | Choi et al. ............. | 365/185.17 |
| 6,798,683 | B2 * | 9/2004 | Hosono et al. ................ | 365/63 |
| 6,894,931 | B2 * | 5/2005 | Yaegashi et al. ....... | 365/185.22 |
| 2002/0118569 | A1 * | 8/2002 | Jeong et al. ............ | 365/185.18 |
| 2003/0048662 | A1 * | 3/2003 | Park et al. ............. | 365/185.18 |
| 2004/0145024 | A1 * | 7/2004 | Chen et al. ................. | 257/390 |

FOREIGN PATENT DOCUMENTS

| | | |
|---|---|---|
| KR | 1999-0057230 | 7/1999 |
| KR | 2002-0067380 | 8/2002 |
| WO | WO 01/33571 | 5/2001 |

OTHER PUBLICATIONS

English language abstract of Korean Publication No. 1999-0057230.
English language abstract of Korean Publication No. 2002-0067380.

\* cited by examiner

*Primary Examiner*—Hoai V Ho
*Assistant Examiner*—Anthan T Tran
(74) *Attorney, Agent, or Firm*—Marger Johnson & McCollom, P.C.

(57) ABSTRACT

A program method of a non-volatile memory device comprises setting a string select line to a predetermined voltage, setting a selected word line to a program voltage and unselected word lines to a pass voltage respectively. The program voltage is varied according to an arrangement of the selected word line. Problems arising from capacitive coupling between adjacent signal lines are alleviated.

8 Claims, 5 Drawing Sheets (Vpass1 > Vpass2)

(Vpgm1 > Vpgm2)
(Vpass1 > Vpass2)

(Vpgm1 > Vpgm2)

PROGRAM METHOD OF NON-VOLATILE MEMORY DEVICE

CROSS-REFERENCE TO RELATED APPLICATIONS

This is a Continuation of U.S. patent application Ser. No. 10/976,628, filed on Oct. 29, 2004, now pending, which claims priority under 35 U.S.C. § 119 of Korean Patent Application 2004-34863, filed on May 17, 2004, the entire contents of which are hereby incorporated by reference.

FIELD OF THE INVENTION

The present invention is a semiconductor memory device, and, in particular, a method of programming a non-volatile memory device.

BACKGROUND OF THE INVENTION

Demand for erasable and programmable semiconductor memory devices capable of retaining data without a refresh function is on the rise. Further, attempts for improving the storage capacitance and integration of the memory device are increasing. A non-volatile memory device offers the large-scale storage capacity and high integration, without refresh of stored data, and one example of the device is a NAND-type flash memory device. Since the NAND-type flash memory device retains the data even in a case of power-off, it is widely used in applications where the possibility of power supply interruption is present such as portable terminal equipment, a portable computer, and so on.

Conventional non-volatile memory devices like the NAND-type flash memory device include a type of electrically erasable and programmable read-only memory (EEPROM) device typically referred to as "a flash EEPROM device." Flash EEPROM devices generally include a semiconductor substrate (or bulk) of a first conductivity type, e.g. P-type; spaced source and drain regions of a second conductivity type, e.g. N-type, in the substrate; a channel region at a face of the substrate, between the spaced source and drain regions; a floating gate for storing charge carriers when the device is programmed; and a control gate which overlies the floating gate, opposite the channel region.

An array in the well-known NAND-type flash memory device is shown in FIG. 1. Referring to FIG. 1, the memory cell array 10 includes a plurality of cell strings 11 corresponding to bit lines. Here, two bit lines BL0 and BL1 and two cell strings 11 corresponding thereto are exemplified in FIG. 1, for the sake of convenience. Each of the cell strings 11 is composed of a string select transistor SST as a first select transistor, a ground select transistor GST as a second select transistor, and a plurality of EEPROM cells MC0 through MCm being serially connected between the select transistors SST and GST. The string select transistor SST has a drain connected to a corresponding bit line and a gate connected to string select line SSL. The ground select transistor GST has a source connected to a common source line CSL and a gate connected to a ground select line GSL. Between the source of the string select transistor SST and the drain of the ground select transistor GST, the flash EEPROM cells MCm-MC0 are serially connected, which are respectively connected to word lines WLm-WL0 corresponding thereto.

FIG. 2 is a timing diagram for describing a program method of the non-volatile memory device in FIG. 1.

Before describing a program method, as well known, the memory cells in the memory cell array 10 are erased at a certain threshold voltage, e.g. −1V. For the purpose of programming the memory cells, a high voltage, e.g. 20V, is applied to a word line of a selected memory cell for a predetermined time. Thus, the selected memory cell is charged to a higher threshold voltage while the threshold voltages of unselected memory cells remain unchanged.

Referring to FIG. 2, a ground path is blocked by applying 0V to the gate of the ground select transistor GST. A zero voltage (0V) potential is applied to a selected bit line, e.g., BL0, and a power supply voltage Vcc as the program inhibit voltage is applied to an unselected bit line, e.g., BL1. At the same time, a given voltage (e.g., the power supply voltage) is applied to the string select line, i.e., the gate of the string select transistor SST connected to the bit line BL1, which causes the source of the string select transistor SST (or the channel of a program inhibited cell transistor) to be charged up to Vcc-Vth (Vth is a threshold voltage of the string select transistor). Here, the string select transistor SST is substantially blocked or shut off. A time period for the aforementioned operation is referred to "a bit line setup period."

Next, the channel voltage Vchannel of the program inhibited cell transistor is boosted by applying a high voltage, e.g. a program voltage Vpgm, to the selected word line, and applying a lower, e.g. a pass voltage Vpass, to the unselected word lines. Thus, Fowler-Nordheim (F-N) tunneling is prevented between a floating gate and the channel region. This retains the initial erased state of the program inhibited cell transistor. A time period for such an operation is referred to "a program period." When a program voltage is applied to the word line, the voltage is applied not only to the selected memory cell but also to the unselected memory cells along the same word line for programming. Thus, the unselected memory cell, in particular the memory cell adjacent to the selected memory cell, is programmed. The unintentional programming of an unselected memory cell connected to a selected word line is referred to herein as "program disturb."

One of the ways for preventing program disturb is a program inhibit method employing a self-boosting scheme. The program inhibit method employing the self-boosting scheme is disclosed in U.S. Pat. No. 5,677,873 entitled "Method of Programming Flash EEPROM Integrated Circuit Memory Devices to Prevent Inadvertent Programming of Nondesignated NAND memory cells therein." and U.S. Pat. No. 5,991,202 entitled "Method for Reducing Program Disturb during Self-Boosting in a NAND flash Memory," which are incorporated herein by reference.

After programming for the select memory cell is complete, a recovery operation for discharging charges of the bit line is performed.

The aforementioned program method has the following problem. As memory devices are scaled down, the space between adjacent signal lines is reduced. Thus, there arises capacitive coupling between adjacent signal lines through parasitic capacitance that exists between the adjacent signal lines. For example, when a program voltage Vpgm or a pass voltage Vpass is applied to a word line WLm adjacent to a string select line SSL (or located just below the string select line), as illustrated in FIG. 2, a voltage (e.g., Vcc) of the string select line SSL becomes higher than the power supply voltage Vcc due to capacitive coupling with the word line WLm. Due to the boosted voltage of the string select line SSL, charges that are charged by the self-boosting operation at a channel of a program inhibited cell transistor are leaked out to a bit line through the string select transistor (it is changed from a shut-off state to a turn-on state). That is, as illustrated in FIG. 2, a channel voltage Vchannel (or an inhibit voltage Vinhibit) of the program inhibited cell transistor is lowered by delta V (it is determined by a coupling ratio of a word line to a string select line and a program/pass voltage) in proportion to the boosted voltage of the string select line SSL. Therefore, program speed is dropped. This makes a threshold voltage distribution broader. Furthermore, the aforementioned program disturb may result.

SUMMARY OF THE INVENTION

It is therefore an object of the invention to provide a program method of a non-volatile memory device capable of improving the reliability.

It is another object of the invention to provide a program method of a non-volatile memory device capable of changing a program voltage according to a location of a selected word line.

It is another object of the invention to provide a program method of a non-volatile memory device capable of preventing program disturb due to capacitive coupling between a string select line and an adjacent word line thereto.

In accordance with one aspect of the present invention, a program method of a non-volatile memory device is provided which comprises setting a string select line to a predetermined voltage, and setting a selected word line to a program voltage and unselected word lines to a pass voltage respectively. The program voltage is varied according to an arrangement of the selected word line.

In an exemplary embodiment, when one of the unselected word lines is adjacent to the string select line, a voltage lower than the pass voltage is supplied to the adjacent unselected word line to the string select line.

In an exemplary embodiment, the predetermined voltage is lower than the voltage supplied to the adjacent unselected word line to the string select line.

In an exemplary embodiment, the string select line is set to the predetermined voltage before the selected and unselected word lines are set to corresponding voltages, respectively.

In an exemplary embodiment, the method further comprises setting each bit line to either a power supply voltage or a ground voltage according to data to be programmed after the selected and unselected word lines are set to corresponding voltages, respectively.

In an exemplary embodiment, the string select line is set to the predetermined voltage after the selected and unselected word lines are set to corresponding voltages, respectively.

BRIEF DESCRIPTION OF THE DRAWINGS

A more complete appreciation of the present invention, and many of the attendant advantages thereof, will become readily apparent as the same becomes better understood by reference to the following detailed description when considered in conjunction with the accompanying drawings in which like reference symbols indicate the same or similar components, wherein.

DETAILED DESCRIPTION OF THE PREFERRED EMBODIMENT

Figure 1:
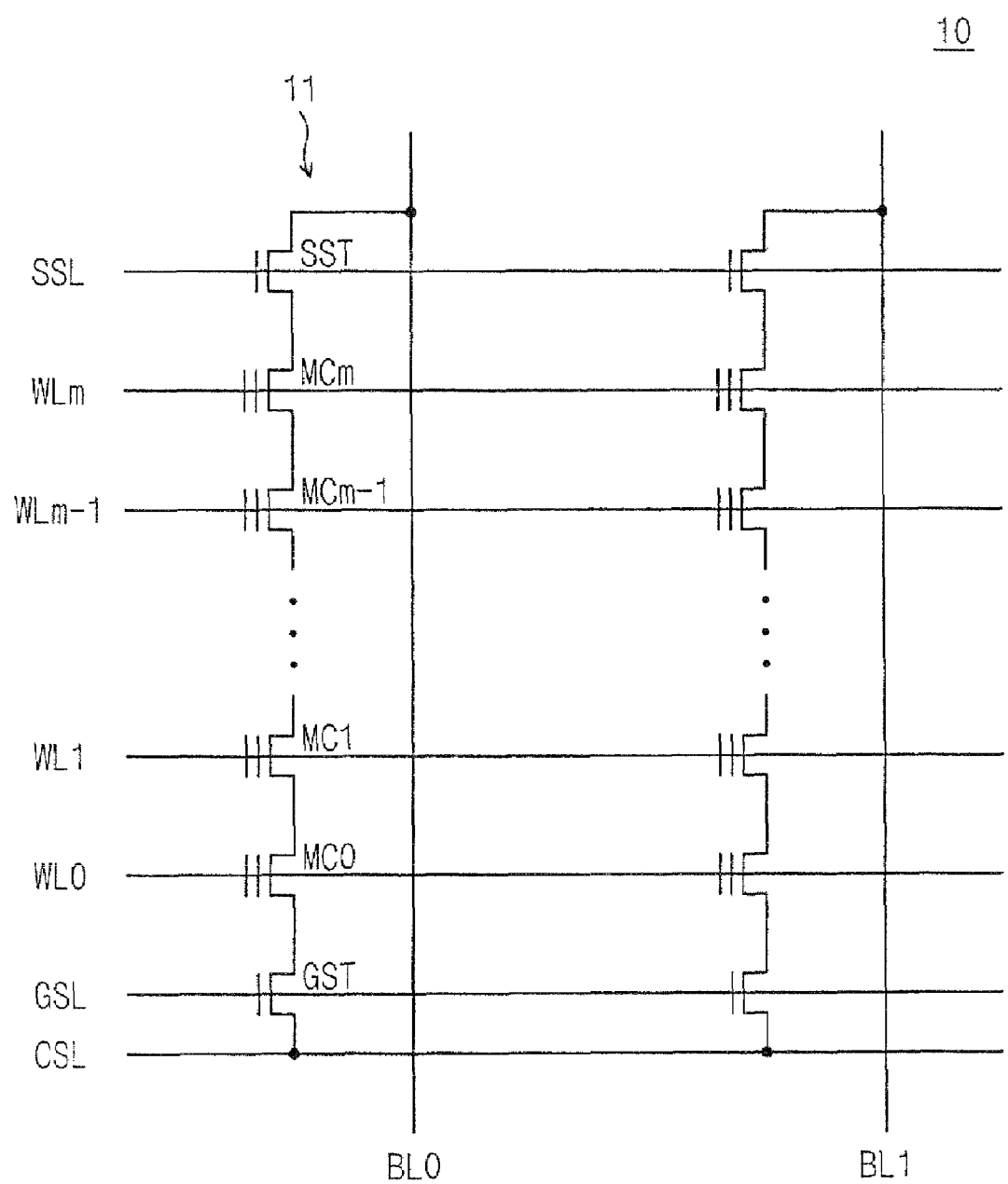
FIG. 1 is a diagram of an array structure of a conventional NAND-type flash memory device.
Figure 2:
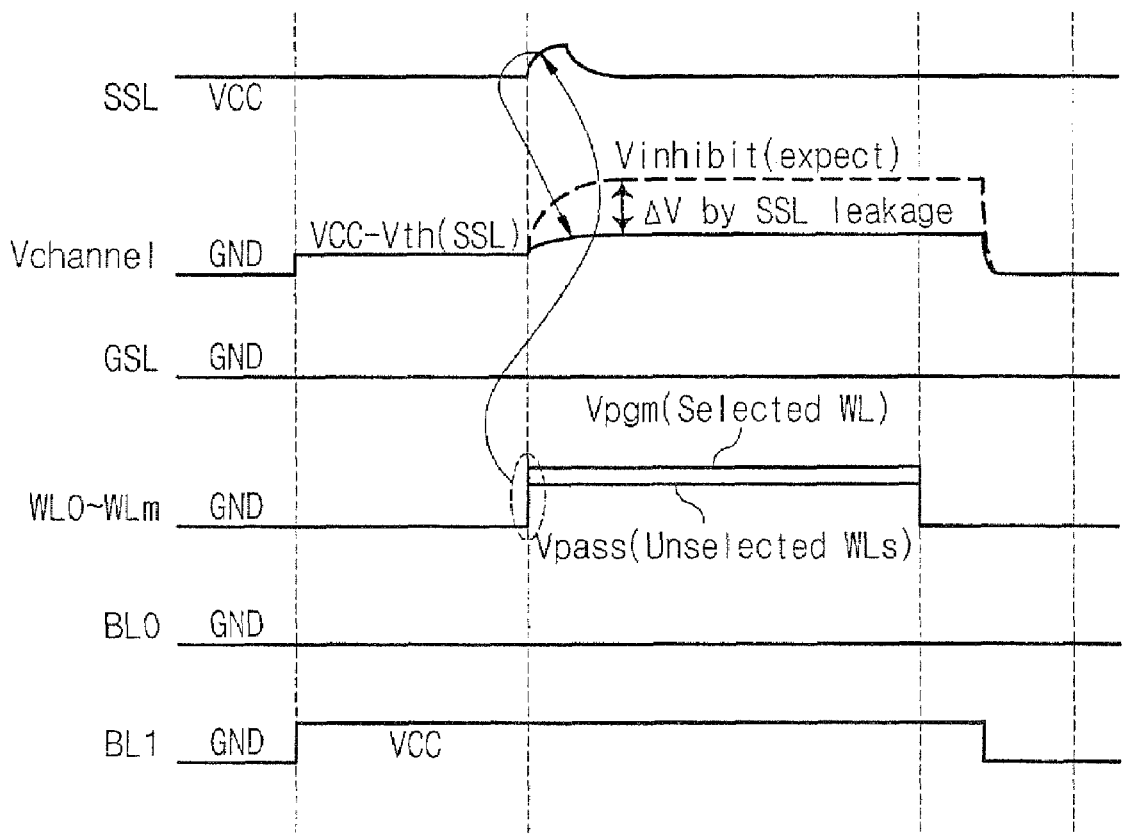
FIG. 2 is a timing diagram for describing a program method of a non-volatile memory device in FIG. 1.

The preferred embodiment of the invention will be more fully described with reference to the attached drawings. In this specification, a pass voltage and a program voltage described in FIG. 2 are respectively referred to as a first pass voltage and a first program voltage and marked by Vpass1 and Vpgm1. In word lines connected to memory cells in a string, a word line connected to a memory cell to be programmed is referred to as a selected word line and remaining word lines as unselected word lines.

In accordance with a program method of a non-volatile memory device of the present invention, when a word line adjacent to a string select line SSL is a selected word line, a second program voltage Vpgm2 lower than the first program voltage Vpgm1 is applied to the selected word line adjacent to the string select line SSL. Alternatively, when a word line adjacent to a string select line SSL is an unselected word line, a second pass voltage Vpass2 lower than the first pass voltage Vpass1 is applied to the unselected word line adjacent to the string select line SSL. Here, the second pass voltage Vpass2 and the second program voltage Vpgm2 are higher than a voltage applied to the string select line SSL. As the second program voltage Vpgm2 or the second pass voltage Vpass2 is applied to a word line adjacent to the string select line SSL (or located just below the string select line), a voltage (e.g., a power supply voltage) of the string select line SSL is prevented from being boosted higher than the power supply voltage Vcc due to capacitive coupling with an adjacent word line. In other words, charges that are charged at a channel of a program inhibited cell transistor are prevented from being leaked out to a bit line through a string select transistor SST.

Figure 3:
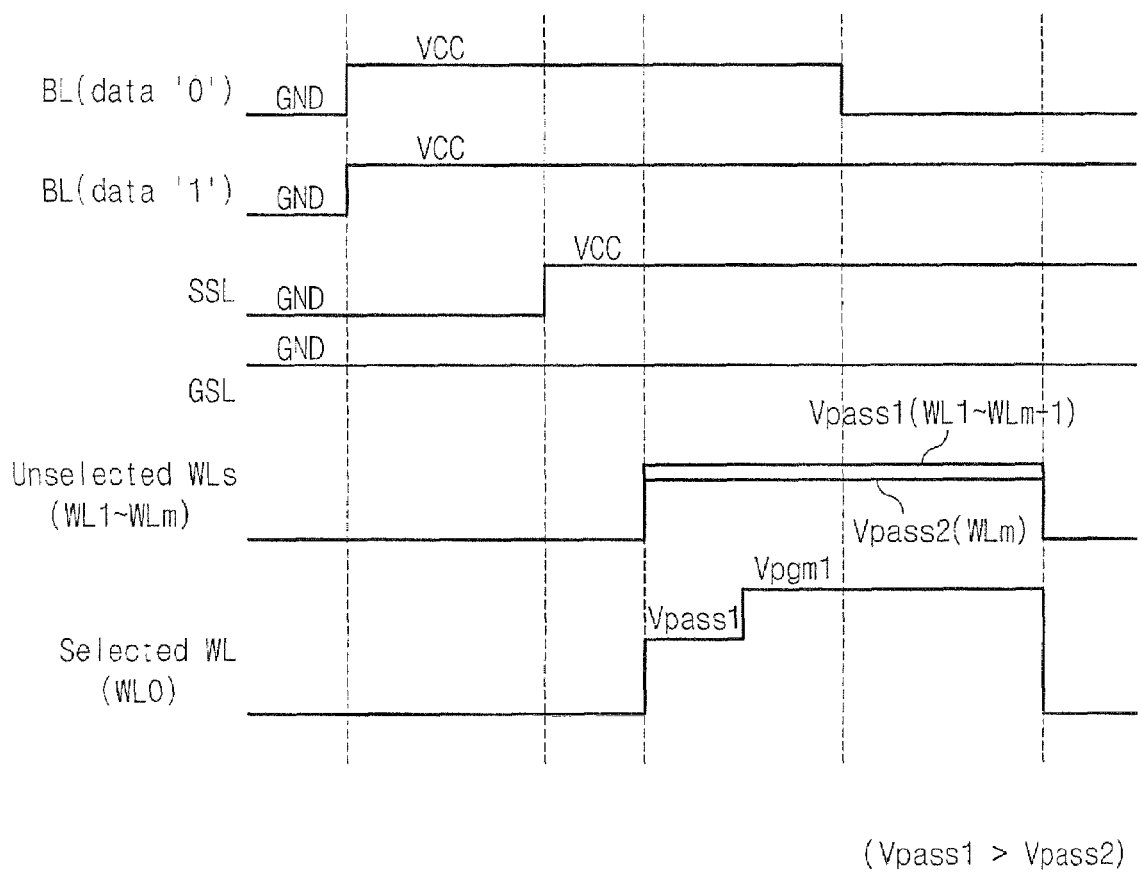
FIGS. 3 to 5 are timing diagrams for describing program methods of a non-volatile memory device according to exemplary embodiments of the present invention.

FIG. 3 is a timing diagram for a program method of a non-volatile memory device according to a first embodiment of the present invention. Prior to describing a program operation, assume that a word line WLm adjacent to a string select line SSL is an unselected word line. Under this assumption, a program method of a non-volatile memory device according to a first embodiment of the present invention will be more fully described below.

As well known, before memory cells are programmed, they are erased to have, for example, a threshold voltage of −1V. Data to be stored in a memory cell array is loaded onto a sense amplifier and latch circuit (not shown) known as a page buffer circuit by a bit organization structure (e.g., ×8, ×16, etc.). After the data to be programmed is loaded onto the sense amplifier and latch circuit, voltages of word lines WL0-WLm and bit lines BL0 and BL1 will set up according to a given timing. The detailed description is as follows.

The bit lines BL0 and BL1 are pre-charged to a power supply voltage through the sense amplifier and latch circuit. While the bit lines BL0 and BL1 are pre-charged to the power supply voltage, a string select line SSL, the word line WL0-WLm and a ground select line GSL are maintained at the low level of a ground voltage. Since the string select line SSL has the ground voltage, each cell string is electrically separated from a corresponding bit line.

Then, as illustrated in FIG. 3, the power supply voltage Vcc is supplied to the string select line SSL, so that a channel region of each string is charged up to VCC-Vth (Vth is a threshold voltage of the string select transistor). At this time, string select transistors SST of cell strings 11 are shut off. This forces channel regions of the cell strings 11 to be floating. At a state where the string select transistors SST are shut off, the first program voltage Vpgm1 is supplied to a selected word line (e.g., WL0) and the first pass voltage Vpass1 is supplied to unselected word lines (e.g., WL1-WLm-1). At the same time, as illustrated in FIG. 3, the second pass voltage Vpass2 lower than the first pass voltage Vpass1 is supplied to the unselected word line WLm adjacent to the string select line SSL. After a time period, a voltage of the selected word line WL0 is increased from the first pass voltage Vpass1 to the first program voltage Vpgm1. Since the channel regions of the cell strings 11 are floated, they are boosted. Accordingly, memory cells of the selected word line WL0 are not programmed. This is because F-N tunneling is prevented between a floating gate and the channel region.

After the first program voltage Vpgm1 is applied to the selected word line WL0 and a time period elapses, the ground voltage as a program voltage or the power supply voltage as a program inhibit voltage is supplied to each bit line according to the loaded data. For example, the ground voltage is applied to a bit line when data to be programmed is '0,' while the power supply voltage is applied to a bit line when data to be programmed is '1.' A string select transistor connected to a bit line having the ground voltage is changed from a shut-off state to a turn-on state, so that a boosted voltage of a string having a turned-on string select transistor is discharged through the sense amplifier and latch circuit. That is, a channel region of a cell string is supplied with the ground voltage. As the ground voltage is applied to the channel region, a memory cell(s) in the selected word line WL0 is programmed through the above F-N tunneling.

With the above description, in a case where a word line WLm adjacent to the string select line SSL is an unselected word line, it is supplied with the second pass voltage Vpass2 lower than the first pass voltage Vpass1, which prevents a voltage of the string select line SSL from being boosted. In other words, charges, which are charged by a self boosting operation at a channel of a program inhibited cell transistor, can be prevented from being leaked out to a bit line through a string select transistor related thereto.

Figure 4:
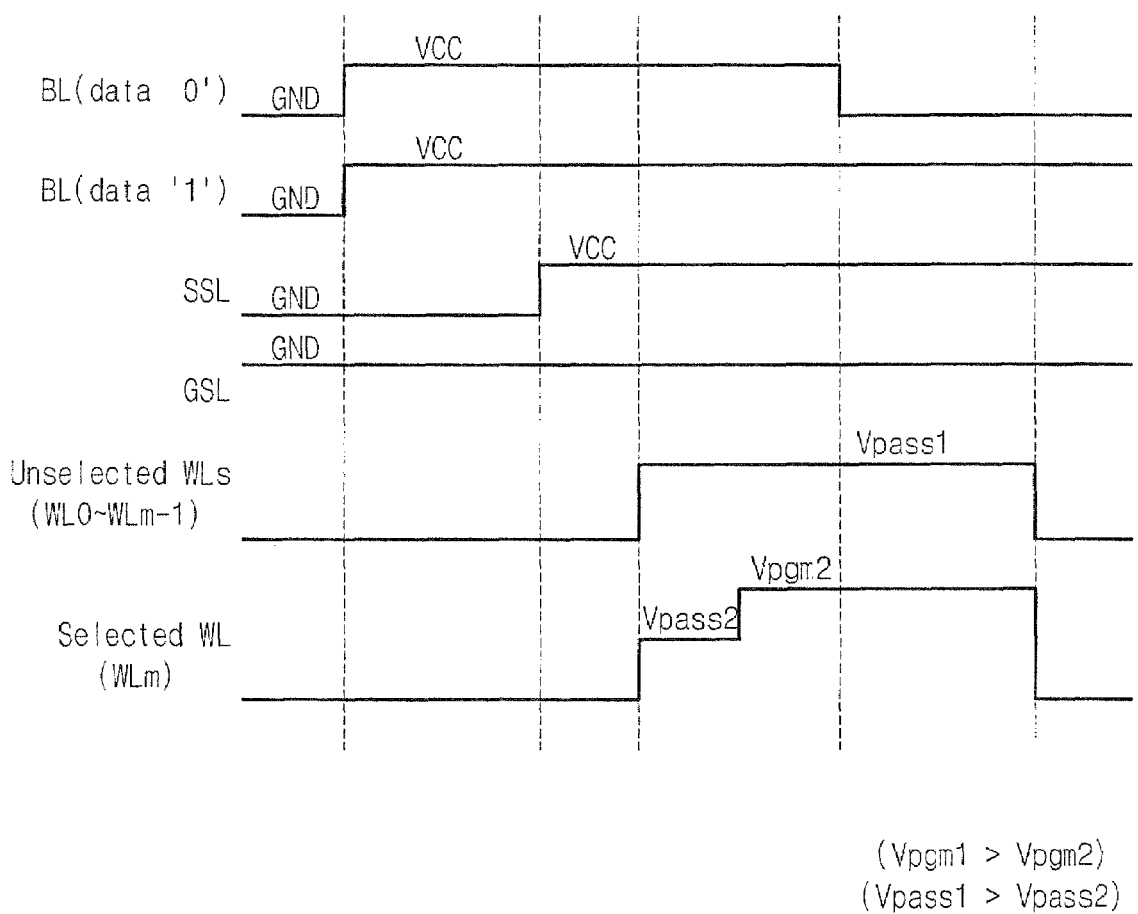

FIG. 4 is a timing diagram for a program method of a non-volatile memory device according to a second embodiment of the present invention.

In the case that a word line WLm adjacent to a string select line SSL is a selected word line, as illustrated in FIG. 4, the second pass voltage Vpass2 lower than the first pass voltage Vpass1 is applied to the selected word line WLm. Then, a voltage of the selected word line WLm is increased up to the second program voltage Vpgm2. Here, the second program voltage Vpgm2 is lower than the first program voltage Vpgm1 and higher than the first and second pass voltages Vpass1 and Vpass2. Each of the remaining unselected word lines WL0-WLm-1 is supplied with the first pass voltage Vpass1. Except for the above difference, the program method of the present non-volatile memory device according to the second embodiment is identical to that in FIG. 3, and description thereof is thus omitted.

Figure 5:
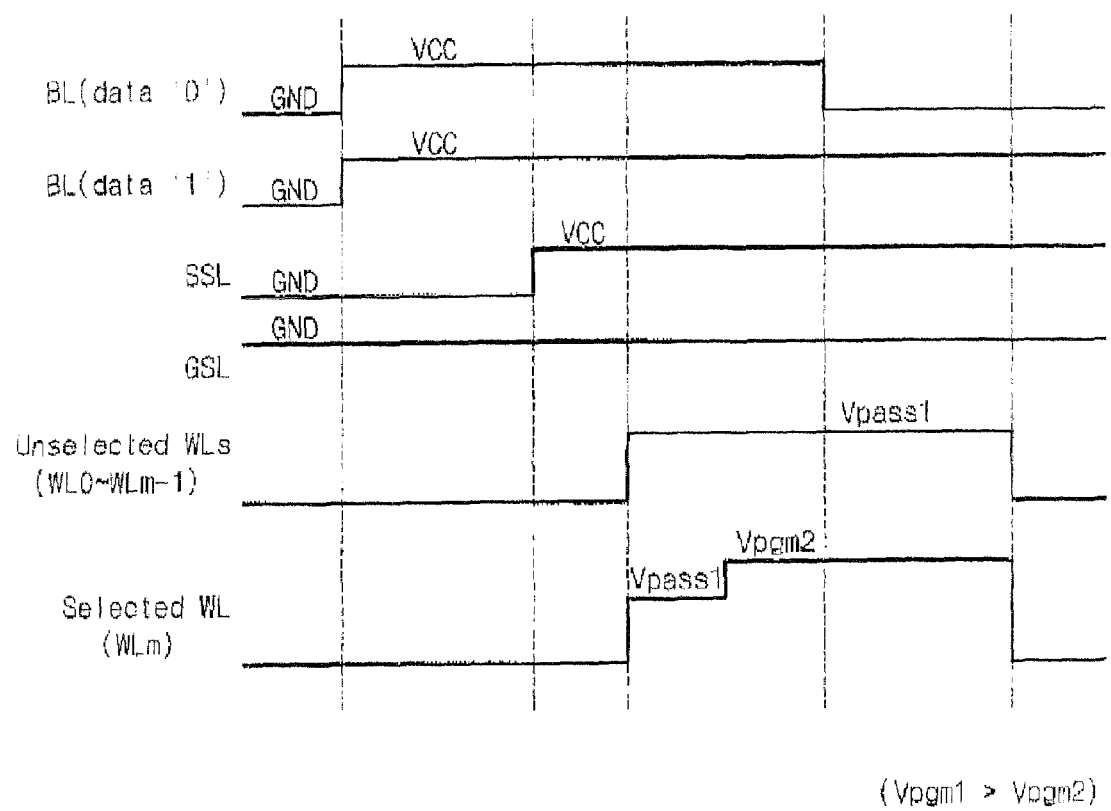

FIG. 5 is a timing diagram for a program method of a non-volatile memory device according to a third embodiment of the present invention.

In the case that a word line WLm adjacent to a string select line SSL is a selected word line, as illustrated in FIG. 5, the first pass voltage Vpass1 is simultaneously supplied to all word lines WL0-WLm. Then, a voltage of the selected word line WLm is increased from the first pass voltage Vpass1 to the second program voltage Vpgm2. Except for the above difference, the program method of the prevent non-volatile memory device according to the third embodiment is identical to that in FIG. 3, and description thereof is thus omitted.

The invention has been described using exemplary preferred embodiments. However, it is to be understood that the scope of the invention is not limited to the disclosed embodiment, On the contrary, it is intended to cover various modifications and similar arrangements. For example, a program voltage supplied to a selected word line can be varied according to its arrangement. As the space between adjacent signal lines is scaled down, program/program inhibit conditions of memory cells may be changed differently from expected conditions due to capacitive coupling. The expected conditions comprise a coupling ratio of a memory cell, loading difference by the length of a signal line, etc. Accordingly, program voltages of different levels can be assigned to corresponding word lines to satisfy the optimum program conditions Unlike the above program methods, the first/second program voltage Vpgm1/Vpgm2 can be applied directly to a selected word line without applying the first/second pass voltages Vpass1/Vpass2 thereto. In other words, the first pass voltage Vpass1 is supplied to each of the unselected word lines while the second program voltage Vpgm2 is applied to the selected word line. A power supply voltage is supplied to a string select line after supplying of the first/second program voltage to the selected word line. A ground voltage as a program voltage can be applied to a bit line before a power supply voltage is applied to a string select line. Combinations of the above program methods can be incorporated in the present invention. As can be realized from the described embodiments above, there are a number of combinations of events and voltage levels involved. The combinations depend on, for example, if the selected word line is adjacent to the string select line, and if a step in the embodiment sets the string select line to the predetermined voltage before the word lines are set to corresponding voltages. Here, the term 'corresponding' refers to the applied voltage respective of what is called out in the specific embodiment.

What is claimed is:

1. A program method of a non-volatile memory device comprising:

setting a string select line to a predetermined voltage after setting bit lines to a pre-charge voltage, respectively;

supplying a first pass voltage to selected and unselected word lines after setting the string select line to the predetermined voltage; and supplying a first program voltage to a selected word line after supplying the first pass voltage to the selected and unselected word lines, wherein whenever an unselected word line is adjacent and capacitively coupled to the string select line, a second pass voltage lower than the first pass voltage is supplied to such an unselected word line, and whenever any of the unselected word lines are not adjacent to the string select line, the first pass voltage is supplied to such unselected word lines, and wherein whenever the selected word line is adjacent to each string select line that is located in the non-volatile memory device, a second program voltage lower than the first program voltage is supplied to the selected word line.

2. The program method of claim 1, wherein the wordline that is adjacent to the string select line is also capacitively coupled to the string select line.

3. A program method of a non-volatile memory device comprising:

setting a string select line to a predetermined voltage;

setting a selected word line to a first program voltage and unselected word lines to a first pass voltage; and determining whenever an unselected word line is adjacent to the string select line and supplying a second pass voltage lower than the first pass voltage to such an unselected word line, and determining whenever any of the unselected word lines are not adjacent to the string select line and supplying the first pass voltage to such unselected word lines, wherein whenever the selected word line is adjacent and capacitively coupled to each string select line that is located in the non-volatile memory device, the selected word line is set to a second program voltage lower than the first program voltage.

4. The program method of claim 3, wherein the string select line is set to the predetermined voltage before the selected and unselected word lines are set to corresponding voltages, respectively.

5. The program method of claim 4, further comprising the step of setting each of a plurality of bit lines to either a power supply voltage or a ground voltage according to data to be programmed after the selected word line is set to the corresponding program voltage.

6. The program method of claim 3, wherein the string select line is set to the predetermined voltage after the selected and unselected word lines are set to corresponding voltages, respectively.

7. The program method of claim 6, further comprising the step of setting each of a plurality of bit lines to either a power supply voltage or a ground voltage before the selected and unselected word lines are set to corresponding voltages, respectively.

8. The program method of claim 3, wherein the predetermined voltage is lower than the second pass voltage.

* * * * *

UNITED STATES PATENT AND TRADEMARK OFFICE
CERTIFICATE OF CORRECTION

| | |
|---|---|
| PATENT NO. | : 7,596,026 B2 |
| APPLICATION NO. | : 11/679072 |
| DATED | : September 29, 2009 |
| INVENTOR(S) | : Oh-Suk Kwon et al. |

It is certified that error appears in the above-identified patent and that said Letters Patent is hereby corrected as shown below:

Column 2, line 40, the word "therein."" should read -- therein," --.

Signed and Sealed this

Fifteenth Day of December, 2009

David J. Kappos
*Director of the United States Patent and Trademark Office*